United States Patent [19]

Beaman

[11] Patent Number: 5,092,782
[45] Date of Patent: Mar. 3, 1992

[54] INTEGRAL ELASTOMERIC CARD EDGE CONNECTOR

[76] Inventor: Brian S. Beaman, 3 Stoutenburgh Dr., Hyde Park, N.Y. 12538

[21] Appl. No.: 648,950

[22] Filed: Feb. 1, 1991

[51] Int. Cl.$^5$ .............................................. H01R 9/09
[52] U.S. Cl. ........................................ 439/65; 29/830; 439/592
[58] Field of Search ...................... 439/59–62, 439/65, 66, 67, 492, 493, 592, 593; 29/830, 846

[56] References Cited

U.S. PATENT DOCUMENTS

| 4,116,516 | 9/1978 | Griffin | 439/493 |
| 4,992,908 | 2/1991 | Solomon | 439/65 |
| 4,993,958 | 2/1991 | Trobough et al. | 439/91 |

OTHER PUBLICATIONS

IBM Bulletin, Essert, vol. 7, No. 10, p. 873, 3-1965.

Primary Examiner—Neil Abrams

[57] ABSTRACT

An integral elastomeric card edge connector provides shorter signal paths through the contact with reduced interference. The card edge contact allows high density interconnection between several layers of multi-layer circuit card without routing signal paths to the card surface. Elastomeric contact tab supports provide positive contact pressure and the necessary wipe action to ensure electrical contact. The process for forming the integral contacts begins with a standard multi-layer card which is then beveled, etched to expose the contact tabs, filled with elastomeric material and processed to expose the tabs supported by elastomeric columns. The connector may be used in card on board technologies or for the connection of multi-chip organic substrates to boards or to other substrates.

10 Claims, 2 Drawing Sheets

INTEGRAL ELASTOMERIC CARD EDGE CONNECTOR

BACKGROUND OF THE INVENTION

1. Field of the Invention

The present invention relates to electrical connectors, and in particular to connectors for circuit cards used in a card-on-board installation. More particularly, the present invention is directed to card edge connectors that provide closely spaced contacts from multiple levels of the circuitry in the card or board.

2. Description of the Prior Art

Modern electronic devices use printed circuit boards to interconnect a number of electrical components. The circuit boards contain multiple levels of conductive circuitry which are formed in the pattern necessary to interconnect the components on those cards. Larger electronic devices require a number of circuit cards to accomplish their specified function. When a number of cards are used they are typically interconnected through the use of a backplane printed circuit board or motherboard. Each of the circuit cards, commonly known as daughter cards, are connected to the motherboard through a series of electrical contacts.

The electrical interconnection between printed circuit boards and the backplane or motherboard have typically been through the use of backplane contacts that connect with surface contacts on the circuit card. The connector on the motherboard is in turn connected to circuitry routed through the motherboard to accomplish the necessary function. An example of a connector according to this prior art technique is shown in U.S. Pat. No. 4,685,031 to Fife et al.

Prior art devices have also attempted to reduce the space occupied by printed circuit boards by mounting them at an angle. U.S. Pat. No. 4,756,694 illustrates this application.

The use of surface contacts on the circuit board requires that the electrical circuitry from lower layers of a multilayer circuit card be brought to the surface. This is typically accomplished through the use of vias or plated through holes. The use of these techniques to extend the circuitry to the card surface has a disadvantage of increasing the signal path length within the card and of reducing the connector density since the surface area available for connector contacts is limited. Finally, the use of present connector technology results in two or more contact interfaces which can have a detrimental effect on signal integrity and reliability of the interface. The two interfaces are first between the circuit card and the connector and second between the connector and the motherboard.

Thus, the technical problem solved by the present invention is the provision of a way to connect circuit cards to motherboards so that signal path length is minimized and the number of interfaces reduced.

SUMMARY OF THE INVENTION

The present invention is directed to providing a card edge connector that is integral to the circuit card. The connector is formed integrally with the card and, through the use of elastomeric columns, provides a complete integral connector. The mating board connector results in a single direct interface between the circuitry of the daughter card and the circuitry of the motherboard. This connection mechanism reduces the signal path between the components by not routing the circuitry to the surface of the card. In addition, this connection results in a single interface between daughter card and motherboard reducing the opportunities for the introduction of signal degradation. Finally, the use of elastomeric columns to support the contact paths of the connector provide the wipe action required to ensure a reliable electrical connection.

BRIEF DESCRIPTION OF THE DRAWING

The preferred embodiment of the present invention will be described with reference to the appended figures in which like components are referenced by the same reference numerals.

DETAILED DESCRIPTION OF THE PREFERRED EMBODIMENT

Figure 1:
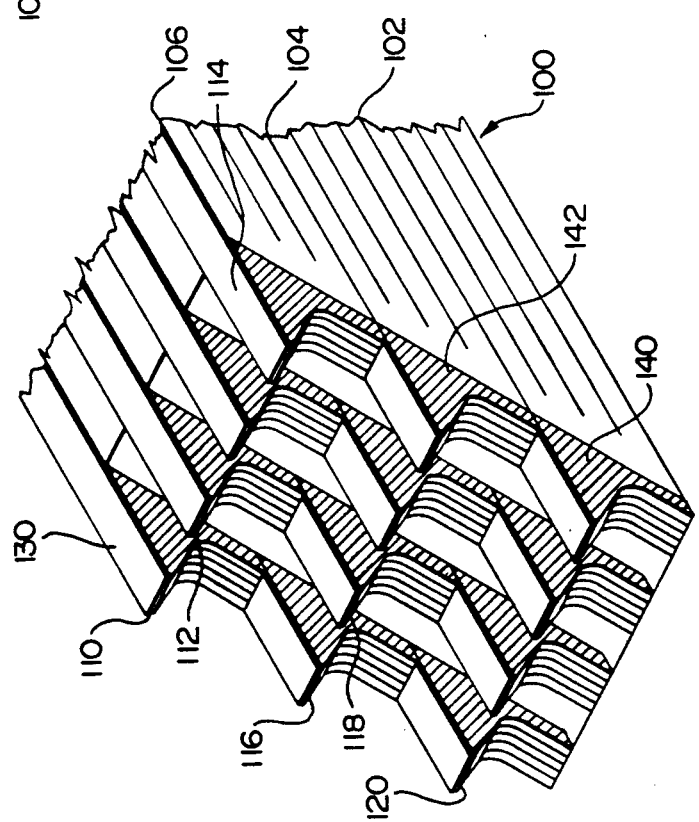
FIG. 1 is an enlarged isometric view of a portion of an edge connector according to the present invention.

The present invention is directed to providing a connector for a printed circuit card. The printed circuit card of the present invention shown generally at 100 in FIG. 1 is formed using known card formation techniques. The card typically is an organic card with imbedded copper circuitry with contact tab extending to the edge of the card. The contact tabs are provided in multiple layers e.g. 102, 104, 106 with each of the layers containing circuit routing as required by the application. The organic card can be made from a variety of known materials such as FR4 fiberglass epoxy laminate.

The edge connector of the present invention results from processing the card to expose contact tabs at different levels within the layers of the circuit card. Elastomeric materials such as Dow Corning 184 silicone encapsulant, is used to create a flexible contact path. The preferred embodiment employs gold plated tabs to improve the electrical connection between the card and the mother board.

The use of elastomeric material to create a flexible contact pad provides the compression force necessary to make good electrical contact. Because each contact has an associated flexible pad, each contact has independent compression. This independent compression allows for thereby adapting to any variance in the surface of the mating motherboard contacts. The elastomer further provides the wipe action necessary during compression to ensure good electrical contact.

An integral elastomeric card edge connector according to the present invention results in a card with high density contacts, for example, with a pitch of 0.020 inches or less.

An edge connector according to the present invention can be used in a variety of applications. One application is the use for a high density card on board package design. Another application is for use with large multichip organic substrates. The edge connector can be used to interconnect the substrate to a printed circuit board or another substrate on one or more sides. The substrate could be connected to two different printed circuit boards on opposite sides of the substrate. The connection of two substrates to each other can be accomplished by mounting the angled edges end to end. In any application, an accurate means of aligning the angled contacts on the card edge with flat connectors on the mating board is critical for high density interconnection.

The motherboard to which the card is to be connected is formed with a plurality of gold plated flat surface contact pads. The contact pads are spaced such that each contact pad is associated with at least one of the contacts from the circuit card. Connection redundancy can be provided by having two or more paths defined for the same signal between the card and motherboard. The alignment mechanism for aligning the card and board is critical to high density applications. For example, to achieve a 0.020 inch pitch preferably requires the provision of a hard tooled pin and hole alignment mechanism having tight tolerances.

Figure 2:
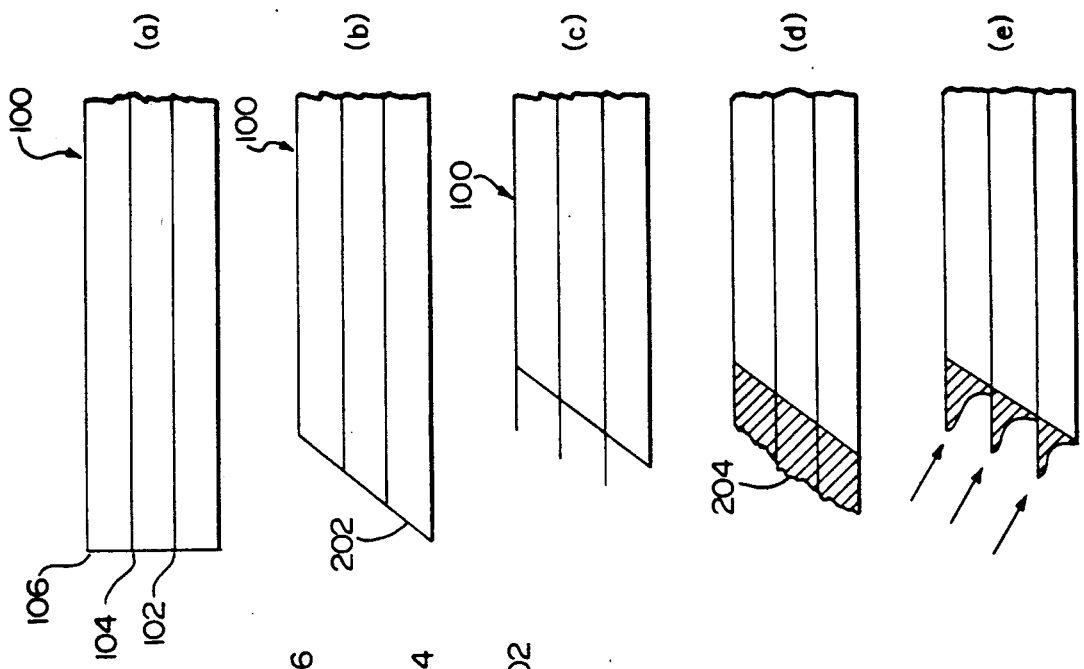
FIG. 2(a)–2(e) are side views of a circuit card showing the changes occurring as it is processed according to the present invention.

An integral elastomeric card edge connector according to the present invention is formed by the following process which will be described with reference to FIG. 2. The process begins with a standard multi-layered circuit card 100 having embedded copper edge circuitry 102, 104, 106. The edge on which the connection is to be formed is identified and a bevel is created through mechanical grinding or similar process creating bevel 202 (FIG. 2(b)). Alternatively, the card could be formed with the necessary bevel. The bevel exposes the ends of the copper contact tabs 110, 112, 114, 116, 118, 120, etc. (FIG. 3) on the multiple layers. The next step involves etching the epoxy or glass material to expose a length of the copper contacts as shown in FIG. 2(c). This etching can be accomplished by laser ablation or plasma arc etching.

The exposed contacts are linked together with copper tie bars (not shown) to provide mechanical strength and to allow gold electroplating of the individual contact surfaces 130.

An elastomeric resin is next applied to the surface edge to create the individual elastomeric columns. The resin is potted and cured forming a large elastomeric section in the area of the contacts (204 in FIG. 2(d)).

The copper tie bars are removed from the contacts, for example, by mechanical trimming. The elastomeric columns 140, 142 under the copper contact tabs are next formed. Laser ablation, using an eximer laser can be used to form the elastomeric columns. When laser ablation is used, the circuit card is positioned so that the contact tabs mask portions of the elastomer allowing only the excess areas to be removed the laser would be directed along the areas shown in FIG. 2(e). The remaining elastomer forms the elastomeric columns used to support the connection tabs. The angle and depth of the laser ablation process can be adjusted to change the resilient characteristics of the elastomer columns.

Figure 3:
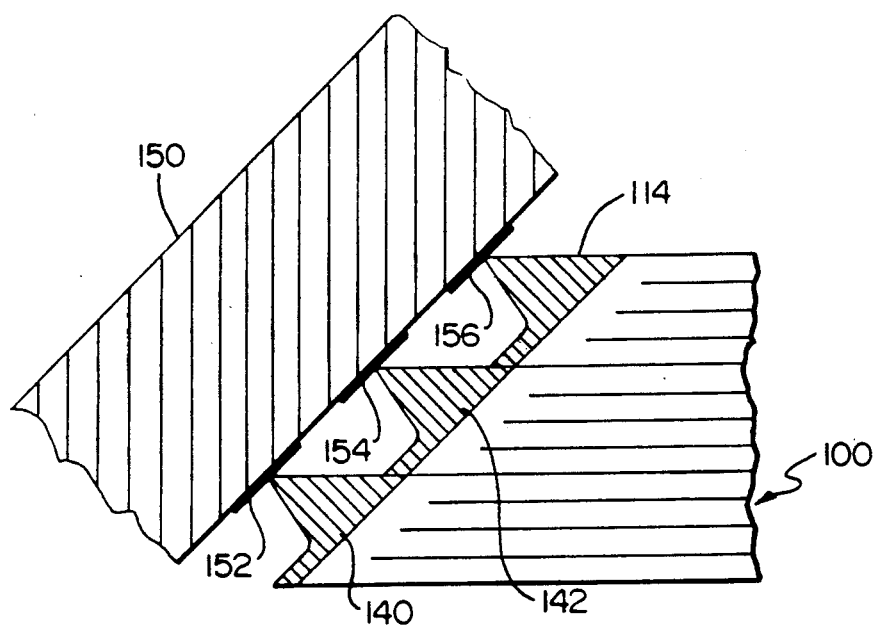
FIG. 3 is a side view of a card and mating motherboard according to the present invention at the initial point of contact between the card and the board.
Figure 4:
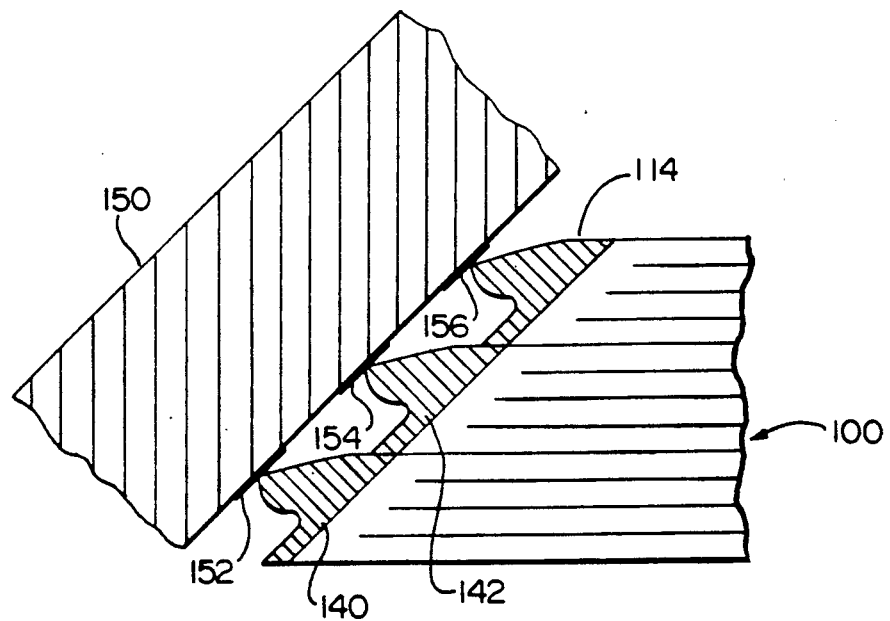
FIG. 4 is a side view of a card and board according to the present invention after the card has been engaged with the board.

The contacts are used to connect a card to a backplane 150 as shown in FIGS. 3 and 4. Backplane 150 has a plurality of surface contacts 152, 154, 156 spaced to mate with contacts from the circuit card 100.

After connection pressure is applied, the contacts, e.g. 114, wipe backplane surface contact 156, and form a tight connection.

An integral elastomeric card edge connector according to the present invention provides several advantages over the prior art. In particular, the present invention provides a card circuitry path that is shorter than prior art circuit paths because the signal path need not be routed to the surface using plated through holes or vias. In addition, the connection formed by an edge connector of the present invention has only one interface as opposed to the two or more interfaces typical in using prior art connector mechanisms. The reduction in connection interfaces reduces signal degradation and reliability problems.

I claim:

1. A method of forming an integral card edge connector for connecting electrical circuitry formed in a plurality of layers of a multi-layer organic circuit card to a second circuit card, the method comprising the steps of:
   forming a beveled card edge to expose said electrical circuitry;
   etching said organic card material at said beveled edge to expose a linear portion of said circuitry, said linear portion forming a contact tab;
   filling said beveled area with an elastomeric material; and
   processing said connector edge to remove elastomeric material such that said contact tabs are exposed on one side and are supported by an elastomeric column under the other side.

2. The method of claim 1 further comprising the step of linking said exposed contact tabs with a tie bar to provide additional mechanical strength during processing, and trimming said linking material before processing the edge to remove elastomeric material.

3. The method of claim 2 further comprising the step of electroplating said contact tabs with gold to increase electrical conductivity.

4. The method of claim 1 wherein said processing step comprises the steps of:
   positioning said card with respect to a laser device such that the laser device is directed at said card at an obtuse angel to the longitudinal axis of said card;
   activating said laser to remove said elastomeric material in addresses not shielded from said laser by said contacts.

5. A card edge connector for connecting a first multi-layered circuit card to a second multi-layered circuit card, wherein said first and second multi-layered circuit cards are each rigid composite materials configured to receive passive and active electronic components, wherein said second circuit card has a plurality of coplanar contacts, said connector comprising:
   a plurality of singulated, flexible contacts, said contacts having:
      a plurality of singulated contact pads extending laterally from a first edge of said first multi-layer circuit cards, each of said contact pads being mechanically independent of others of said contact pads; and
      flexible support means for maintaining constant pressure between said singulated contacts and said second circuit card, wherein each singulated contact pad has an independent flexible support means.

6. The connector of claim 5 wherein said flexible support means comprise elastomeric columns individually supporting said contact pads.

7. The connector of claim 6 wherein said elastomeric columns are tapered from a full horizontal extension under said singulated contacts to a point in contact with said multi-layered circuit card, said point being horizontally closer to said multi-layered card than the end of said singulated contact.

8. The connector of claim 7 wherein said elastomeric columns are tapered from a full horizontal extension under said independent contact pads to a point in contact said multi-layered contact card.

9. A connection system for connecting a plurality of multi-layer circuit cards to a base circuit card, wherein each of said plurality of multi-layer circuit cards and said base circuit card are made from rigid composite materials adapted to receive active and passive electronic components, the system comprising:

base circuit card contacts disposed on a first planar surface of said base circuit card;

on each of said plurality of multi-layer circuit cards:

a plurality of mechanically independent contact pads extending laterally from one or more of the layers on a first edge of said multi-layer circuit card; and flexible support means for maintaining contact pressure between said contact pads and said base circuit card contacts, wherein said flexible support means independently supports each of said contact pads.

10. The connector of claim 9 wherein said flexible support means comprise elastomeric columns individually supporting said contact pads.

* * * * *